United States Patent [19]
Glaise

[11] Patent Number: 5,459,740
[45] Date of Patent: Oct. 17, 1995

[54] METHOD AND APPARATUS FOR IMPLEMENTING A TRIPLE ERROR DETECTION AND DOUBLE ERROR CORRECTION CODE

[75] Inventor: Rene J. Glaise, Nice, France

[73] Assignee: International Business Machines Corporation, Armonk, N.Y.

[21] Appl. No.: 981,155

[22] Filed: Nov. 23, 1992

[30] Foreign Application Priority Data

Mar. 31, 1992 [EP] European Pat. Off. .............. 92480054

[51] Int. Cl.$^6$ .................................................. G06F 11/10
[52] U.S. Cl. ........................................ 371/37.1; 371/37.8
[58] Field of Search ..................... 371/37.1, 37.2, 371/37.3, 37.4, 37.5, 37.6, 37.7, 37.8, 37.9, 38.1, 39.1

[56] References Cited

U.S. PATENT DOCUMENTS

| | | | |
|---|---|---|---|
| 4,509,172 | 4/1985 | Chen | 371/37.8 |
| 4,556,977 | 12/1985 | Olderdissen et al. | 371/37.1 |
| 4,703,485 | 10/1987 | Patel | 371/37.1 |
| 4,747,103 | 5/1988 | Iwamura et al. | 371/37.4 |
| 4,856,004 | 8/1989 | Foster et al. | 371/37 |
| 4,890,286 | 12/1989 | Hirose | 371/37.8 X |
| 4,961,193 | 10/1990 | Debord et al. | 371/37.2 |
| 5,040,179 | 8/1991 | Chen | 371/37.1 |
| 5,208,815 | 5/1993 | Kojima | 371/37.1 |
| 5,216,676 | 6/1993 | Kimura | 371/37.1 |

FOREIGN PATENT DOCUMENTS

| | | |
|---|---|---|
| 0204576 | 12/1986 | European Pat. Off. . |
| 0316063 | 5/1989 | European Pat. Off. . |
| 0341862 | 11/1989 | European Pat. Off. . |

OTHER PUBLICATIONS

Hwang, T; "Parallel Decoding of Binary BCH Codes"; Electronics Letters; Nov. 21, 1991.

Wei, S. et al. "High-Speed hardware decoder for double-error-correcting binary BCH codes"; IEE Proceedings; Jun. 1989.

Köksal F. Z. et al. "Comments on the Decoding Algorithms of DBEC-TBED Reed Solomon Codes"; IEEE Trans. on Computers; Feb. 1992.

International Journal of Electronics, vol. 64, No. 4, Apr. 1988, London GB pp. 637–640.

Patent Abstracts of Japan, vol. 4, No. 31, (P-2) 18 Mar. 1980 & JP-A-55 994 623 (Kokusai Electric Co. Ltd) 14 Jan. 1980.

Primary Examiner—Roy N. Envall, Jr.
Assistant Examiner—Brian C. Oakes
Attorney, Agent, or Firm—Joscelyn G. Cockburn

[57] ABSTRACT

A method and apparatus for achieving the detection of triple errors and the correction of double errors in data stored in a memory or processed in a data processing system. The method and apparatus being based on a modification of a standard Bose Chauduri Hocquenghem (BCH) code that permits a reduction of the decoding circuitry needed to achieve the detection and correction of the errors.

13 Claims, 9 Drawing Sheets

FIG. 1

| | | |
|---|---|---|
| ...1 | $\alpha^0$ | A 15 ELEMENTS GALOIS FIELD: |
| ..1. | $\alpha^1$ | |
| .1.. | $\alpha^2$ | - $\alpha^0$ IS THE IDENTITY ELEMENT OF THE MULTIPLICATION |
| 1... | $\alpha^3$ | |
| ..11 | $\alpha^4$ | |
| .11. | $\alpha^5$ | |
| 11.. | $\alpha^6$ | |
| 1.11 | $\alpha^7$ | -MULTIPLICATIONS ARE TRUE MODULO 15. FOR INSTANCE: |
| .1.1 | $\alpha^8$ | |
| 1.1. | $\alpha^9$ | |
| .111 | $\alpha^{10}$ | |
| 111. | $\alpha^{11}$ | $\alpha^3 \times \alpha^7 = \alpha^{10}$ |
| 1111 | $\alpha^{12}$ | |
| 11.1 | $\alpha^{13}$ | $\alpha^3 \times \alpha^{13} = \alpha^1$ |
| 1..1 | $\alpha^{14}$ | |

FIG. 3

PRIOR ART BCH H-MATRIX

|  | ←——— 15 COLUMNS ———→ |
|---|---|
| ROW 0 | 1  1  1  1  1  1  1  1  1  1  1  1  1  1  1 |
| ROW a | $\alpha^0\ \alpha^1\ \alpha^2\ \alpha^3\ \alpha^4\ \alpha^5\ \alpha^6\ \alpha^7\ \alpha^8\ \alpha^9\ \alpha^{10}\ \alpha^{11}\ \alpha^{12}\ \alpha^{13}\ \alpha^{14}$ |
| ROW b | $\alpha^0\ \alpha^3\ \alpha^6\ \alpha^9\ \alpha^{12}\ \alpha^{15}\ \alpha^{18}\ \alpha^{21}\ \alpha^{24}\ \alpha^6\ \alpha^{30}\ \alpha^{33}\ \alpha^{36}\ \alpha^{39}\ \alpha^{42}$ |

FIG. 2

| + | $\alpha^0$ | $\alpha^1$ | $\alpha^2$ | $\alpha^3$ | $\alpha^4$ | $\alpha^5$ | $\alpha^6$ | $\alpha^7$ | $\alpha^8$ | $\alpha^9$ | $\alpha^{10}$ | $\alpha^{11}$ | $\alpha^{12}$ | $\alpha^{13}$ | $\alpha^{14}$ |
|---|---|---|---|---|---|---|---|---|---|---|---|---|---|---|---|
| $\alpha^0$ | 0 | | | | | | | | | | | | | | |
| $\alpha^1$ | $\alpha^4$ | 0 | | | | | | | | | | | | | |
| $\alpha^2$ | $\alpha^8$ | $\alpha^5$ | 0 | | | | | | | | | | | | |
| $\alpha^3$ | $\alpha^{14}$ | $\alpha^9$ | $\alpha^6$ | 0 | | | | | | | | | | | |
| $\alpha^4$ | $\alpha^1$ | $\alpha^0$ | $\alpha^{10}$ | $\alpha^7$ | 0 | | | | | | | | | | |
| $\alpha^5$ | $\alpha^{10}$ | $\alpha^2$ | $\alpha^1$ | $\alpha^{11}$ | $\alpha^8$ | 0 | | | | | | | | | |
| $\alpha^6$ | $\alpha^{13}$ | $\alpha^{11}$ | $\alpha^3$ | $\alpha^2$ | $\alpha^{12}$ | $\alpha^9$ | 0 | | | | | | | | |
| $\alpha^7$ | $\alpha^9$ | $\alpha^{14}$ | $\alpha^{12}$ | $\alpha^4$ | $\alpha^3$ | $\alpha^{13}$ | $\alpha^{10}$ | 0 | | | | | | | |
| $\alpha^8$ | $\alpha^2$ | $\alpha^{10}$ | $\alpha^0$ | $\alpha^{13}$ | $\alpha^5$ | $\alpha^4$ | $\alpha^{14}$ | $\alpha^{11}$ | 0 | | | | | | |
| $\alpha^9$ | $\alpha^7$ | $\alpha^3$ | $\alpha^{11}$ | $\alpha^1$ | $\alpha^{14}$ | $\alpha^6$ | $\alpha^5$ | $\alpha^0$ | $\alpha^{12}$ | 0 | | | | | |
| $\alpha^{10}$ | $\alpha^5$ | $\alpha^8$ | $\alpha^4$ | $\alpha^{12}$ | $\alpha^2$ | $\alpha^0$ | $\alpha^7$ | $\alpha^6$ | $\alpha^1$ | $\alpha^{13}$ | 0 | | | | |
| $\alpha^{11}$ | $\alpha^{12}$ | $\alpha^6$ | $\alpha^9$ | $\alpha^5$ | $\alpha^{13}$ | $\alpha^3$ | $\alpha^1$ | $\alpha^8$ | $\alpha^7$ | $\alpha^2$ | $\alpha^{14}$ | 0 | | | |
| $\alpha^{12}$ | $\alpha^{11}$ | $\alpha^{13}$ | $\alpha^7$ | $\alpha^{10}$ | $\alpha^6$ | $\alpha^{14}$ | $\alpha^4$ | $\alpha^2$ | $\alpha^9$ | $\alpha^8$ | $\alpha^3$ | $\alpha^0$ | 0 | | |
| $\alpha^{13}$ | $\alpha^6$ | $\alpha^{12}$ | $\alpha^{14}$ | $\alpha^8$ | $\alpha^{11}$ | $\alpha^7$ | $\alpha^0$ | $\alpha^5$ | $\alpha^3$ | $\alpha^{10}$ | $\alpha^9$ | $\alpha^4$ | $\alpha^1$ | 0 | |
| $\alpha^{14}$ | $\alpha^3$ | $\alpha^7$ | $\alpha^{13}$ | $\alpha^0$ | $\alpha^9$ | $\alpha^{12}$ | $\alpha^8$ | $\alpha^1$ | $\alpha^6$ | $\alpha^4$ | $\alpha^{11}$ | $\alpha^{10}$ | $\alpha^5$ | $\alpha^2$ | 0 |

FIG. 4

MODIFIED BCH H-MATRIX

← 15 COLUMNS →

| | | | | | | | | | | | | | | |
|---|---|---|---|---|---|---|---|---|---|---|---|---|---|---|
ROW 0: 1  1  1  1  1  1  1  1  1  1  1  1  1  1  1

ROW a: $\alpha^0$ $\alpha^1$ $\alpha^2$ $\alpha^3$ $\alpha^4$ $\alpha^5$ $\alpha^6$ $\alpha^7$ $\alpha^8$ $\alpha^9$ $\alpha^{10}$ $\alpha^{11}$ $\alpha^{12}$ $\alpha^{13}$ $\alpha^{14}$ ROW b: $\alpha^{15}$ $\alpha^{14}$ $\alpha^{13}$ $\alpha^{12}$ $\alpha^{11}$ $\alpha^{10}$ $\alpha^9$ $\alpha^8$ $\alpha^7$ $\alpha^6$ $\alpha^5$ $\alpha^4$ $\alpha^3$ $\alpha^2$ $\alpha^1$ ↑ COLUMN i     ↑ COLUMN j

FIG. 5

| d | Sa × Sb | $(\alpha^0 + \alpha^d)^{-1}$ |
|---|---|---|
| 1 | $\alpha^1 + \alpha^{15-1} = \alpha^7$ | $\alpha^{11}$ |
| 2 | $\alpha^2 + \alpha^{15-2} = \alpha^{14}$ | $\alpha^7$ |
| 3 | $\alpha^3 + \alpha^{15-3} = \alpha^{10}$ | $\alpha^1$ |
| 4 | $\alpha^4 + \alpha^{15-4} = \alpha^{13}$ | $\alpha^{14}$ |
| 5 | $\alpha^5 + \alpha^{15-5} = \alpha^0$ | $\alpha^5$ |
| 6 | $\alpha^6 + \alpha^{15-6} = \alpha^5$ | $\alpha^2$ |
| 7 | $\alpha^7 + \alpha^{15-7} = \alpha^{11}$ | $\alpha^6$ |

FIG. 6

MODIFIED PARITY CHECK H-MATRIX

| | 0 | 1 | 2 | 3 | 4 | 5 | 6 | 7 | 8 | 9 | 10 | 11 | 12 | 13 | 14 | |
|---|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | 1 | ROW 0 |
| 1 | 1 | . | . | . | 1 | . | . | 1 | 1 | . | 1 | . | 1 | 1 | 1 | ROW a |
| 2 | . | 1 | . | . | 1 | 1 | . | 1 | . | 1 | 1 | 1 | 1 | . | . | (FIG. 4) |
| 3 | . | . | 1 | . | . | 1 | 1 | . | 1 | . | 1 | 1 | 1 | 1 | . | |
| 4 | . | . | . | 1 | . | . | 1 | 1 | . | 1 | . | 1 | 1 | 1 | 1 | |
| 5 | 1 | 1 | 1 | 1 | . | 1 | . | 1 | 1 | . | . | 1 | . | . | . | ROW b |
| 6 | . | . | . | 1 | 1 | 1 | 1 | . | 1 | . | 1 | 1 | . | . | 1 | (FIG. 4) |
| 7 | . | . | 1 | 1 | 1 | 1 | . | 1 | . | 1 | 1 | . | . | 1 | . | |
| 8 | . | 1 | 1 | 1 | 1 | . | 1 | . | 1 | 1 | . | . | 1 | . | . | |

FIG. 7

| T |
|---|
| 1 1 1 1 1 1 1 1 |
| . 1 1 . 1 . 1 1 1 |
| . 1 . 1 1 1 . . |
| 1 . 1 . 1 1 1 1 |
| 1 1 . 1 . 1 1 1 |
| . 1 1 . 1 . . . |
| 1 . 1 . 1 1 . . 1 |
| . 1 . 1 1 . . 1 . |
| 1 . 1 1 . . 1 . |

| T-1 |
|---|
| 1 . 1 1 1 . . 1 . |
| 1 1 . 1 1 . 1 . . |
| . . . 1 . 1 . 1 1 |
| 1 . 1 1 . . . 1 |
| 1 . . 1 1 1 . 1 1 |
| 1 1 . . 1 . 1 1 1 |
| . . 1 1 1 1 . 1 |
| 1 1 1 1 . 1 . . . |
| 1 1 1 1 . . . . 1 |

FIG. 8

H1 IS THE SYSTEMATIC FORM OF THE MODIFIED H MATRIX ABOVE
COLUMNS ARE ODD WEIGH

| DATA BITS | ECC BITS |
|---|---|
| 1 . 1 1 1 . | 1 . . . . . . . . |
| . 1 . 1 1 1 | . 1 . . . . . . . |
| 1 . . 1 . 1 | . . 1 . . . . . . |
| 1 1 1 1 . . | . . . 1 . . . . . |
| . 1 1 1 1 . | . . . . 1 . . . . |
| . . 1 1 1 1 | . . . . . 1 . . . |
| 1 . 1 . . 1 | . . . . . . 1 . . |
| 1 1 1 . 1 . | . . . . . . . 1 . |
| . 1 1 1 . 1 | . . . . . . . . 1 |

| S1 PARITY | Sa x Sb | TYPE OF ORRORS : |
|---|---|---|
| ODD | $\alpha^0$ | SINGLE |
| EVEN | $\alpha^0, \alpha^5, \alpha^7, \alpha^{10}$ $\alpha^{11}, \alpha^{13}$, OR $\alpha^{14}$ | DOUBLE |
| ODD | IS NOT $\alpha^0$ | TRIPLE |

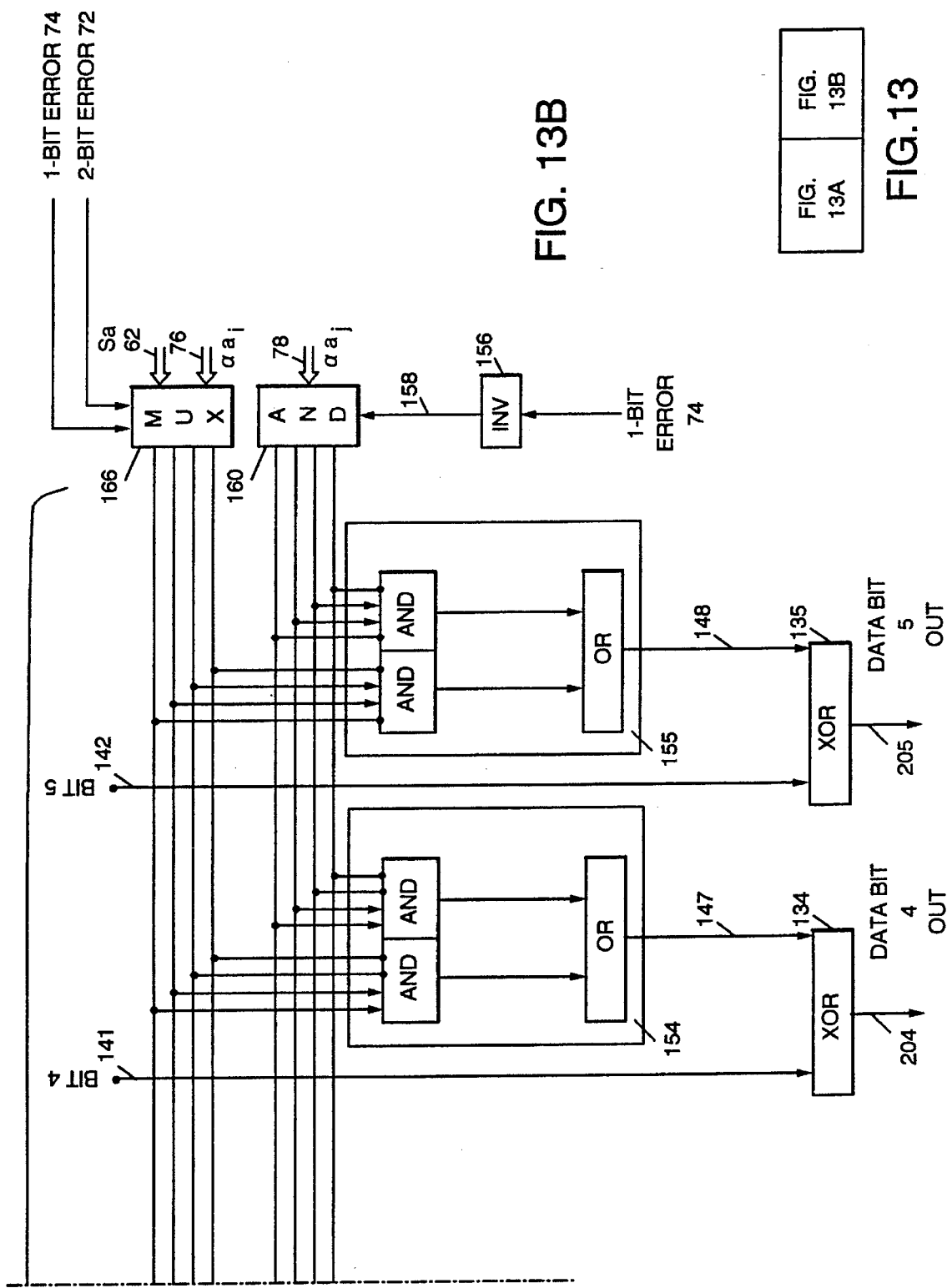

METHOD AND APPARATUS FOR IMPLEMENTING A TRIPLE ERROR DETECTION AND DOUBLE ERROR CORRECTION CODE

The subject invention relates to a method and an apparatus for achieving the detection of triple errors and the correction of double errors in data stored in a memory or processed in a data processing system, said method and apparatus being based on a modification of a standard Bose Chauduri Hocquenghem BCH code that permits a reduction of the decoding circuitry needed to achieve the detection and correction of the errors.

BACKGROUND OF THE INVENTION

The memory part of a processor is a significant contributor to the failure rate of a computer. Error correcting codes such as the Hamming codes along with some techniques like the sparing, deallocation or the invert and retry techniques have been implemented to improve the mean time between failure MTBF to an acceptable level. However the demand for machines of better quality offering non disruptive service for longer period of times forces the designer to consider more powerful code than the simple Hamming codes used up to now.

Bose Chaudri Hocquenghem BCH codes are based on the GALOIS field theory. A Galois field is a finite collection of binary elements generated from an irreducible polynomial. A list of irreducible polynomials can be found in the book "Error Correcting Codes" by Peterson and Weldon, the MIT press, Second Edition 1972, for instance.

For the sake of illustration, FIG. 1 represents a $(2^4-1)=$ 15-element Galois field obtained from a specific irreducible generator polynomial of degree 4, represented as the binary expression 10011.

Each element (with i being an integer comprised between 0 and 14) of the field is obtained from $\propto^i$, for example $\propto^2 = \propto^1 \times \propto^1$, $\propto^3 = \propto^2 \times \propto^1$, etc, where the multiplications are performed modulo the polynomial generator.

$\propto^{15}=$ is equal to $\propto^0=0001$ which is the identity element of the multiplication.

Two types of operations can be performed within this Galois field: a multiplication modulo 15 (the number of non null element of the field) and an addition modulo 2 (bit by bit). The result of the addition or multiplication of two elements belongs to the field. The rule for the multiplication is shown in FIG. 1. The multiplication by the identity element returns to the same value while the addition of an element of the field to itself gives the null element.

FIG. 2 shows the addition table for this particular Galois field. The null element 0000 for the addition is noted 0. The operations are commutative.

The standard BCH H matrix that would normally be built on above Galois Field is shown in FIG. 3. It is a (15,6) Double Error Correction, triple Error Detection DEC-TED code. It is only shown here for illustration, there is no practical application for this, since 9 check bits would have to be added to protect only 6 data bits. Using irreducible polynomials of degree 5 and 6 would permit to build respectively a (31, 20) and a (63,50) type of code. The latter would fit a full word memory interface for instance. Thirteen check bits would have to be added to the 32 data bits to get a depopulated (45,32) code. Each element in the third row is obtained by raising the corresponding element in the second row at a power 3. because of the rule stated above i.e. the multiplications are done modulo 15, $\propto^{30}=\propto^0$, $\propto^{33}=\propto^3$, $36=\propto^6$, $\propto^{39}=\propto^9$, $\propto^{42}=\propto^{12}$, the third row of the matrix is made of only five elements of the Galois Field and the sequence $\propto^0$, $\propto^3$, $\propto^6$, and repeats itself three times to fit the 15 column matrix. The first row is an all 1 row. It is added to enhance the code to the detection of all triple errors, otherwise there will be no way to make a difference between a double and a triple error.

Using this matrix to check data needs complex decoding circuitry to achieve the correction of up to two errors and the detection of three errors aligned in the same word and thus the error correction and detection operations impair the performance of the overall system incorporating such a data checking means.

SUMMARY OF THE INVENTION

Consequently an object of the present invention is to provide a simplified data checking device based upon a modified BCH matrix.

The method according to the present invention implements a triple error detection/double error correction code in a m-bit word comprising data bits and error correction code ECC bits. Each ECC bit is the parity bit of a selected data bit field defined by the binary elements set to a first value (1) in successive rows of a coding matrix comprising m columns and $r=2n+1$ rows. The method comprises the steps of:

generating a coding matrix H1, using a (rxr) square matrix T, such that $T \times T^{-1}=$ the identity matrix I and $H1=T^{-1} \times H$, where H is a matrix having m columns and r rows, with a first row R0, comprising m binary elements set to the first value, a first set Ra of rows comprising m n-bit elements of a Galois field wherein one element is the identity element of the multiplication $\propto^0$, said elements being generated from a irreducible generator polynomial of degree n, and a second set Rb of rows comprising the same elements as the first set arranged in such a way that in each column the product modulo the generator polynomial of the element in the first set by the element in the second set is equal to is a constant value which in a preferred embodiment is equal to the identity element of the Galois field, T being computed is such a way that H1 is the systematic form of the matrix H, computing the error correction bits to be added to the data bits using the matrix H1, in order to code a word, determining a first error syndrome S1 of a so-coded word using the matrix H1, computing a second error syndrome $S=T \times S1$ which is the error syndrome corresponding to the matrix H, analyzing the first and second error syndromes for determining the number of bits in error and the position of the bits in error if less than three bits are detected in error.

The analyzing step is made by:

computing the product $P=Sa \times Sb$, where Sa and Sb are subsyndromes of the second syndrome S, corresponding to the first set Ra of rows and the second set Rb of rows of the matrix H, respectively, detecting the parity of the first syndrome S1, generating:

a three bit error indication signal if syndrome S1 has an odd parity and the product P is different from the identity element of the Galois field ($\propto^0$)

a single bit error indication signal if syndrome S1 has an odd parity and the product P is equal to the identity element of the Galois field, a double bit error indication signal if syndrome S1 has an even parity.

The method also comprises the following steps:
building a table comprising the correspondence between the shortest distance between two bits in error, the product P=SaxSb and a value E=$(\propto^0+\propto^d)^{-1}$,
if a two double bit error is detected at the analyzing step, looking at said table for determining the distance d between two bits in error and the corresponding value E, from the product P computed at the analyzing step,
finding the position of one bit in error which corresponds to the column i of the matrix H, in which the element $\propto$ai in the first set Ra of rows is equal to SaxE,
comparing Sa with a first value which is equal to the sum of the elements of the first set Ra of rows in columns i and i+d and with a second value which is equal to the sum of the elements of the second set Rb of rows in columns i and i−d,
finding the position of the second bit in error which corresponds to the column i+d if Sa is found equal to the first value or to the column i−d if Sa is found equal to the second value.

In addition, if a single bit error is detected at the analyzing step, the method comprises the step of finding the position of the bit in error which corresponds to the column i of the matrix H, in which the element $\propto$ai in the first set Ra of rows is equal to Sa.

The bits found in error are inverted for correcting them and generating a corrected word.

The subject invention also relates to the apparatus for implementing said method.

BRIEF DESCRIPTION OF THE FIGURES

FIG. 1 represents the set of 15 elements of a Galois field generated from an irreducible polynomial of degree 4.

FIG. 2 represents the addition table for the elements of the Galois field shown in FIG. 1.

FIG. 3 represents a prior art BCH matrix.

FIGS. 4 and 6 represent the modified matrix H according to the subject invention.

FIG. 5 represents a correspondence table between the shortest distance d, the product SaxSb and a value E to be used for detecting the position of two bits in error.

FIG. 7 represents the matrices T and $T^{-1}$ used for generating the systematic form H1.

FIG. 8 represents the systematic form of H1.

DETAILED DESCRIPTION OF THE INVENTION

Figures 9, 10:
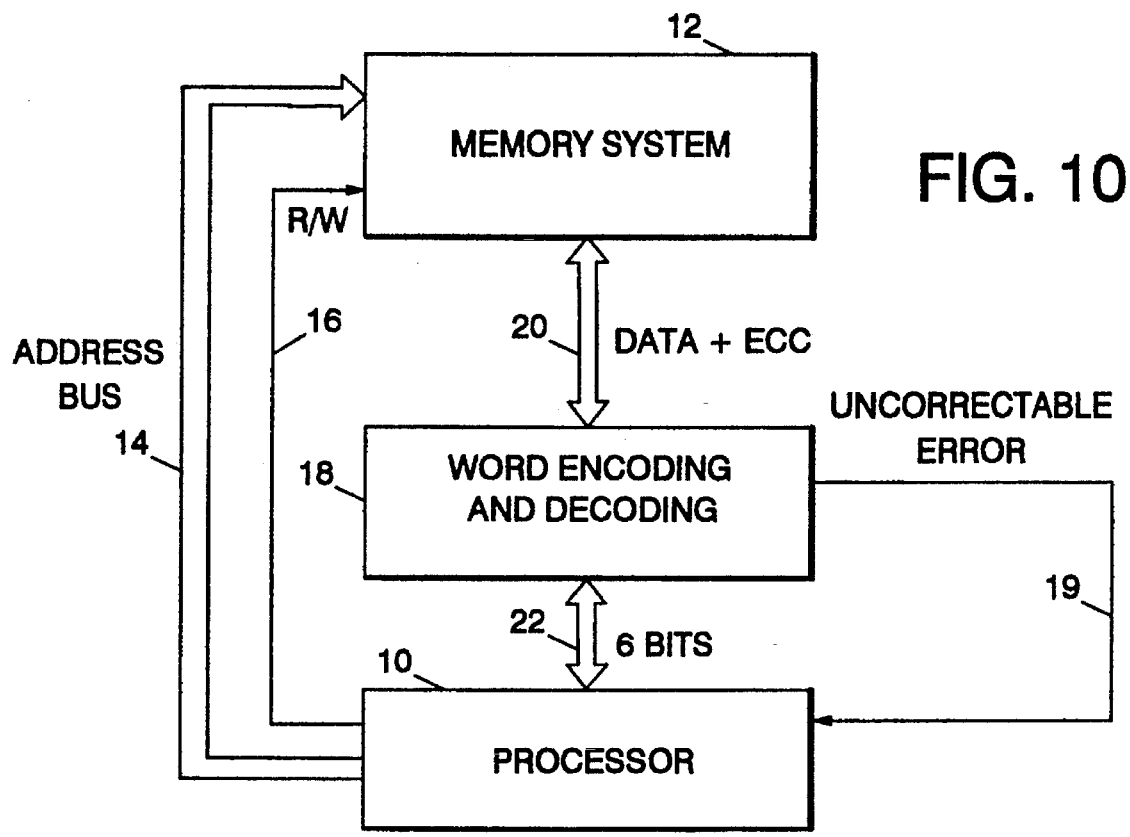
FIG. 9 represents which conditions are met when a single bit error, double bit error or triple bit error has occurred.
FIG. 10 represents the block diagram of the apparatus of the present invention when implemented to code the words to be stored into a memory and decode and correct the words read from the memory.

According to the present invention the Double Error Correction/Triple Error Detection code is based on a modified Bose Chauduri Hocquenghem matrix shown in FIG. 3. Starting from the Galois Field elements shown in FIG. 1, the row 0 and row a are identical to the row 0 and a of the prior art matrix, but the row b is changed as shown in FIG. 4.

In each column of this modified matrix, the product of the elements of the second row a by the corresponding ones of the lower row gives always a instant value which in a preferred embodiment of the invention is chosen equal to the identity element of the Galois field.

FIG. 6 represents the modified H-matrix of FIG. 4 wherein each element $\propto$ has been replaced by its binary value shown in FIG. 1.

The data words are encoded in such a way that a parity bit is included in selected fields of the data words so that the selected fields have an odd parity for example, the selected fields are defined by the "1" in the matrix of FIG. 6. As defined by row 0 of the matrix, the first selected field of a 15-bit words comprises the 15 bits, the second selected field is defined by the second row and comprises bits in position 0, 4, 7, 8, 10, 12, 13, 14. In the same way, the third selected field is defined by the third row, etc.

It will now be described how the words are decoded, in order to detect and possibly correct the errors.

Assuming that two errors affect the columns i=1 and j= 12 as shown in FIG. 4. The three rows are noted 0, a, b from the top to bottom. Thus in row a, $\propto^2$ is named $\propto$ai of the modified H- matrix, $\propto^{12}$ is named $\propto$aj, and in row b, $\propto^{13}$ is named $\propto$bi and $\propto^3$ is named $\propto$bj. S0, Sa, Sb are the three error sub-syndromes which are generated when the word is read from a memory or received at the received side of a transmission system, from rows 0, a and b of the matrix.

Then a double error that affect columns i and j gives the following result:

$$Sa=\propto ai+\propto aj$$

$$Sb=\propto bi+\propto bj$$

The product of the sub-syndromes SaxSb is:

$$\begin{aligned}SaxSb &= (\alpha ai+\alpha aj)x(\alpha bi+\alpha bj)\\ &= \alpha ai x \alpha bi + \alpha aj x \alpha bi + \alpha ai x \alpha bj + \alpha aj + \alpha x bj\end{aligned}$$

x represents the multiplication operator.

In view of the properties of the modified H-Matrix, $\propto ai x \propto bj = \propto aj x \propto bj = \propto^0$ and $\propto^0 + \propto^0 = 0$, then, $$SaxSb=\propto aix\propto bj+\propto ajx\propto bi \quad (1)$$

Thus SaxSb is the sum of the cross product of the elements in the two columns in error. This sum is indicative of how many bits apart the errors are within the word independently of the position of the bits in error. Because the code is circular, equation (1) gives the shortest distance between the two bits in error. As an example, if the two bits in errors are in positions 2 and 5 i.e; 3 bits apart then, $$SaxSb=\propto^{12}+\propto^{18}=\propto^{(15-3)}+\propto^3$$

If the errors affected bits in positions 1 and 13, the result would be the same:

$$SaxSb=\propto^3+\propto^{27}=\propto^3+\propto^{12}=\propto^3+\propto^{15-3}$$

since it is shorter to go from 13 to 1 than the opposite.

The table shown in FIG. 5 is a summary of the shortest distance (d) between the errors for the particular code based on the modified matrix H, along with the value E= $(\propto^0+\propto^0 d)^{-1}$ which is indicative of one of the bit position in error as will be demonstrated later on. E and d are calculated using the addition table shown in FIG. 2.

When the distance between the errors is known, the positions of the two bits in error are found by solving the following equations:

$$Sa = \alpha ai + \alpha aj = \alpha ai + \alpha a(i+d)$$
$$= \alpha ai(\alpha^0 + \alpha^d)$$

Finally, $$\alpha ai = Sa(\alpha^0 + \alpha^d)^{-1}$$

and the second one $\alpha aj$ is either $\alpha ai+d$ or $\alpha a(i-d)$ depending upon which statement is true:

$$Sa = \alpha ai + \alpha a(i+d)$$

or $$Sa = \alpha ai + \alpha a(i-d)$$

It will now be described how the above described principle is implemented to detect and correct the errors in words stored into a memory.

Before being stored, a memory word must be encoded using the modified matrix H shown in FIG. 6. However, the matrix cannot be used as is to encode the words to be stored. It must be transformed into its systematic form H1 to permit the computation of the Error Correcting Code ECC bits added to the data bits coming from the processor into which the memory is incorporated.

The systematic form of the modified matrix H is shown in FIG. 8. The nine most right columns correspond to the ECC bits to be computed from the 6 data bits before storing a word. Again this is an example, there is no practical application for it, since 9 ECC bits would have to be added to 6 data bits only. From the teaching of this example, the man skilled in the art would be able to implement the subject invention, by determining the set of elements of a Galois field generated from an irreducible polynomial of a higher degree and encoding the words using a matrix comprising the elements so determined and having the same property as the modified matrix shown in FIG. 4.

The systematic form HI of the modified matrix H is obtained using two square matrices T and $T^{-1}$ such as $T \times T^{-1} = I$, where I is the identity matrix, and computing $H1 = T^{-1} \times H$ Since Hi is an odd weigh matrix, which means that the number of 1 in each column is odd, the parity of the error syndrome S1 generated upon reading of a word from the memory, indicates if a single, double or triple error has occurred.

An odd syndrome S1 is indicative of a single or triple error, while an even syndrome S1 is indicative of a double error.

That property of the S1 syndrome, combined with the decode of the S syndrome which would be obtained using H as decoding matrix, such as $S = T \times S1$ and the computation of the product of the sub-syndromes Sa and Sb permits to make the difference between a single and double correctable error and a triple detectable but uncorrectable error, as shown in FIG. 9.

If the syndrome S1 is odd and if SaXSb is equal to $\alpha^0$, a single error has occurred.

S1 odd and SaXSb different from $\alpha^0$, indicate that a triple error has occurred. This error is uncorrectable.

S1 even, indicates that a double error has occurred. The bit positions in error can be found by computing d, $\alpha ai$ and $\alpha aj$ as described above.

FIG. 10 represents a logic implementation allowing to implement the encoding of the words to be stored in a memory and the decoding and the words read from the memory.

The processor 10 accesses the memory 12, though address bus and a read/write control signal on line 16. In case of a read operation, the word read from the addressed memory location, comprising the data and ECC bits are provided to the logic circuit 18 through bus 20. Logic circuit 18 decodes the word and if no error, a single bit error or a double bit error is detected, provides the data bits corrected if necessary to the processor through bus 22. If a three bit uncorrectable error is detected, a three-bit error signal is provided to the processor through line 19.

In case of a write operation, the data bits are provided by the processor to logic circuit 18 through bus 22, and are encoded to provide the data bits and ECC bits to the memory through bus 20.

Figure 11:
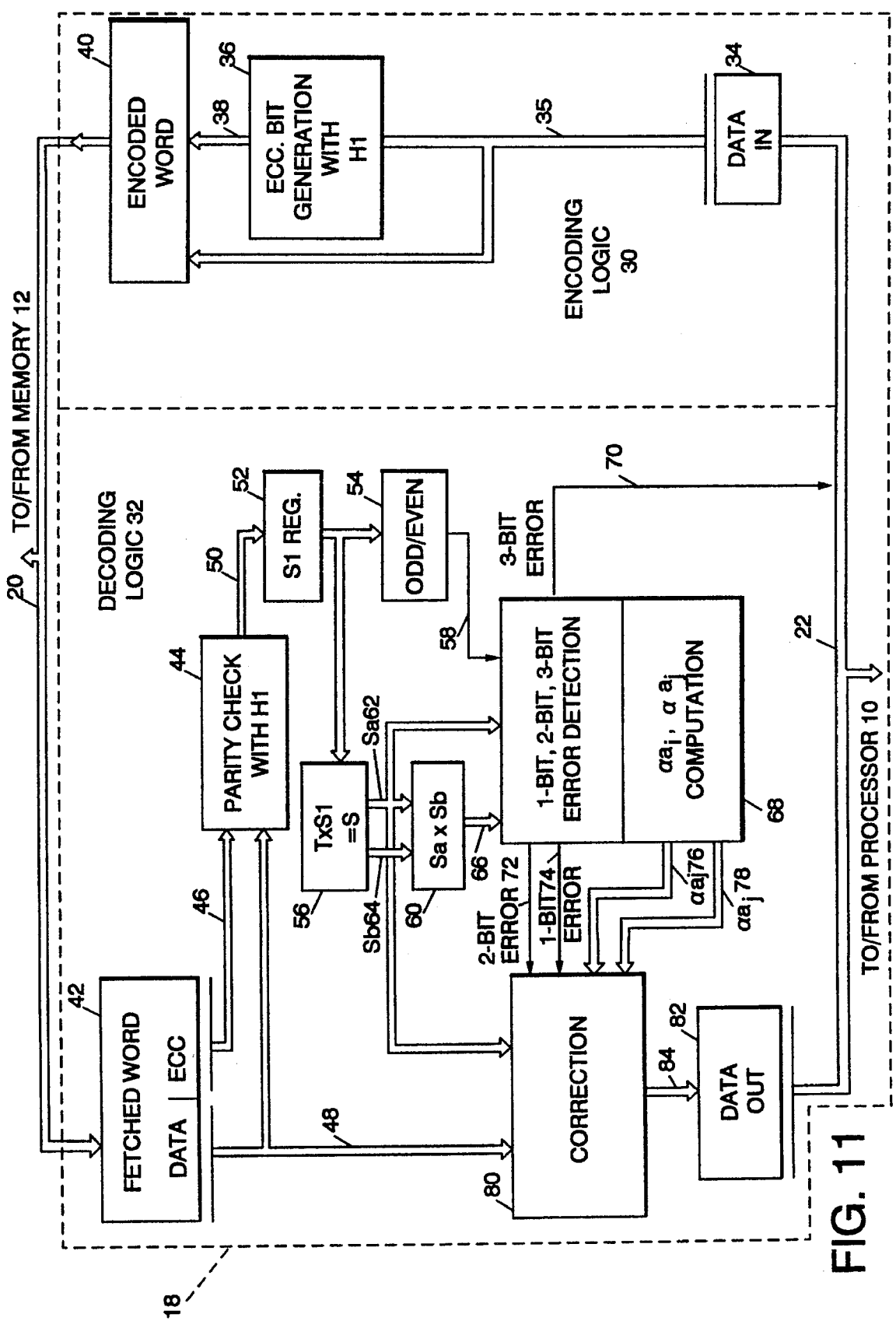
FIG. 11 represents the apparatus of the present invention in more details.

The logic circuit 18 is represented in FIG. 11.

Logic circuit 18 comprise an encoding logic 30 and a decoding logic 32.

The data to be written into the memory are received by the encoding logic into data-in register 34, and provided to an ECC bit generation circuit 36, which computes the ECC bits to be added to the data bits so that the parity of the fields determined by the 1 in the rows of matrix H1 is odd. Obviously, an even parity might also be used.

The ECC bits generated on bus 38 and the data bits from bus 35 are provided into register 40 as the encoded word to be written into the memory through bus 20.

A word fetched from the memory is provided into register 42 from bus 20. The ECC bits and data bits are provided to parity check circuit 44 through bus 46 and 48.

Parity check circuit 44 checks the parity of the fields of data and check bits determined by the matrix H1 to generate the error syndrome S1 on its output bus 50. The syndrome S1 is stored into register 52. Syndrome S1 is provided to ODD/EVEN detection logic and to multiplier circuit 56. ODD/EVEN detection logic detects whether the syndrome S1 has an even or odd parity and generates a 1 level signal on line 58 if the parity is odd, which is indicative of a single bit error or triple bit error.

The multiplier circuit 56, multiplies the syndrome S1 by matrix T to retrieve the S syndrome, which would have been found if the matrix H were used instead of matrix H1.

As described in reference to FIGS. 4 to 9, syndrome S is comprised of sub-syndromes S0, Sa, Sb. Sa and Sb are provided to multiplier circuit 60 through bus 62 and 64.

The product P=SaXSb on bus 66, Sa on bus 62, and the ODD/EVEN signal on line 58 are provided to logic circuit 68, which generates therefrom a 3-bit error signal on line 70, a 2-bit error signal on line 72, a 1-bit error signal on line 74, and computes the $\alpha ai$ and $\alpha aj$ values as described in reference to FIGS. 4 to 9. The $\alpha ai$ and $\alpha aj$ values are provided to correction logic circuit 80 through bus 76 and 78 together with the signals on lines 72 and 74 and Sa on bus 62.

Circuit 68 will be described in more details in reference to FIG. 12.

Correction circuit 80 which will be described in reference to FIG. 14, receives the data bits and correct them if needed, and provide the data bits corrected or not, to data out register 82 through bus 84. The data bits in register 82 are available to the processor.

Figure 12:
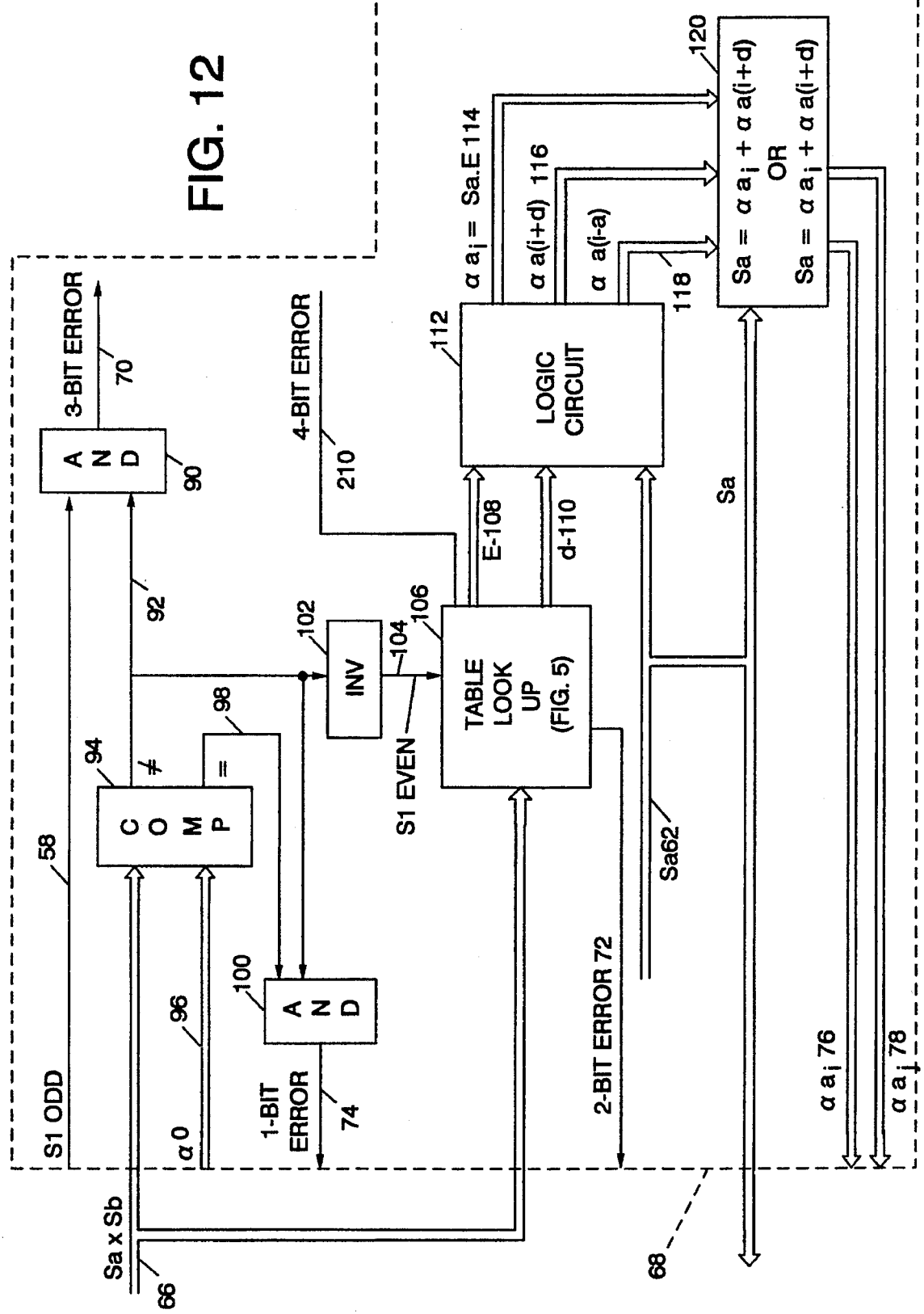
FIG. 12 represents the error detection and error position computation circuit shown as 68 in FIG. 11.

The error detection and $\propto ai$ and $\propto aj$ computation circuit 68 is shown in FIG. 12.

The S1 ODD line 58 is provided to the first input of an AND circuit 90, which receives on its second input 92 a signal at a "1" level provided by comparator 94. Comparator 94 compares the SaxSb product from bus 66 with the value on bus 96. It generates a "1" level signal on its output line 92 when an inequality is detected and a "1" level signal on its output line 98 when an equality is detected.

Thus AND gate 90 provides a 3-bit error signal at a "1" level on its output line 70 when S1 is odd and SaxSb is different from $\propto^0$.

Lines 58 and 98 are provided to the inputs of an AND gate 100 which generates a 1-bit error signal at a "1" level on its output line 74 when S1 is odd and SAxSb is equal to $\propto^0$. The signal on line 58 is provided to an inverter 102 which generates on its output line 104 a signal at a "1" level when S1 is even. This signal activates a table look up circuit 106 which receives the product SaXSb from bus 66 and generates the values E and d on its output busses 108 and 110 respectively, according to the correspondences shown in FIG. 5.

E, d, Sa from bus 108, 110, 62 are provided to a logic circuit 112 which computes $\propto ai = Sa \times E, \propto a(i+d)$ and $\propto(ai-d)$ and provides the results on busses 114, 116 and 118 to a logic circuit 120. The logic circuit 120 compares Sa from bus 66 to $\propto ai+\propto ai+d$ and to $\propto ai+\propto a(i-d)$ and depending upon which equality is true, provides $\propto aj=\propto a(i+d)$ or $\propto aj=\propto a(i-d)$ on its output bus 78 and $\propto ai$ on its output bus 76.

Figure 13A:
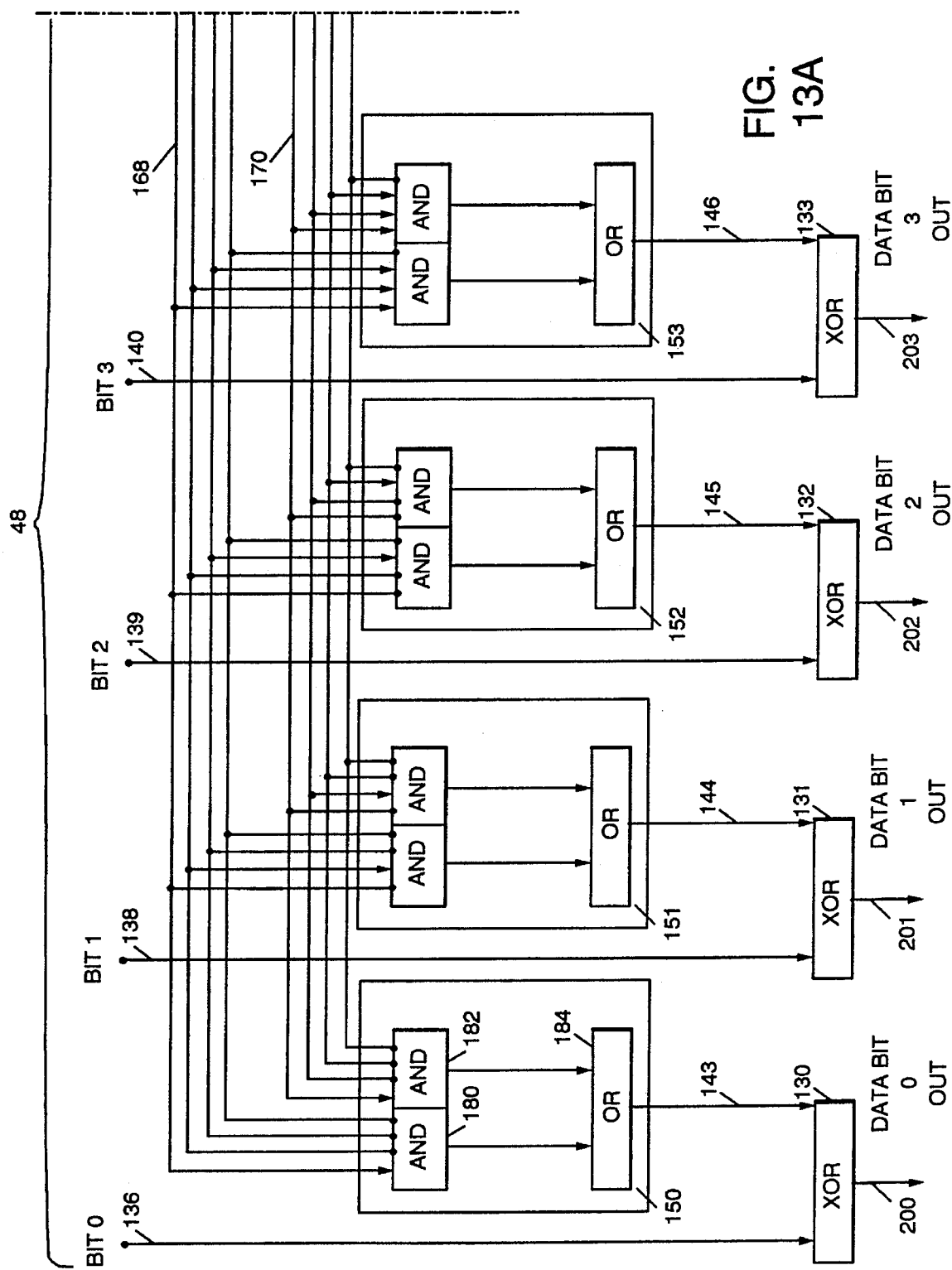
FIG. 13 represents the error correction circuit shown as 80 in FIG. 12.

The correction circuit 80 is shown in FIG. 13.

The correction circuit comprises XOR circuits 130, 131, 132, 133, 134 and 135 which receive the data bits 0 to 5 read from bus 48 on a first input (136 to 142) and an invert control signal on a second output (143 to 148). The invert control signal is provided by logic circuits 150 to 155.

The position of the bit in error in case a 1-bit error is detected is indicated by Sa and the positions of the two bits in error in case a 2-bit error is detected are indicated by $\propto ai$ and $\propto aj$.

If a 1-bit error is detected, signal on line 74 is at a "1" level. This signal is provided to the input of inverter 156, the output line 158 of which is provided to AND gate 160.

The 1-bit error line 74 and 2-bit error line 72 are provided a multiplex circuit 166, which receives as inputs the subsyndrome Sa from bus 62 and the $\propto ai$ value from bus 78, and gates on its output bus the Sa value is the 1-bit error signal is active and the $\propto ai$ value if the 2-bit error signal is active.

$\propto aj$ from bus 78 is provided to the inputs of AND gate 160. In case a 1-bit error is detected, multiplex circuit 166 provides Sa on its output bus 168 and AND gate 160 provides 0000 on its output bus 170. When a 2-bit error is detected multiplex circuit 166 provides $\propto ai$ on its output bus 168 and AND gate 160 provides $\propto aj$ on its output bus 170.

Each circuit 150 to 155 comprises two AND gates 180 and 182 the output lines of which are provided to the inputs of an OR gate 184. OR gate 184 provides the invert control signal on its output line.

The inputs of AND gate 180 are connected to bus 168 and the inputs of AND gates 182 are connected to bus 170.

The arrows on the inputs of AND gates in circuit 150 to 155 indicates that the signal received at these inputs is not inverted and the black circle indicates that the signal received at these input is inverted.

Thus, each AND gate 180 and 182 in circuit 150 to 155 is able to provide a signal at a "1" level on its output when it detects that the values on their inputs correspond to the $\propto ai$ value and possibly to the $\propto aj$ value (in case of a 2-bit error) at the corresponding column 0 to 5 in the matrix shown in FIG. 6.

For example, if the value on bus 168 is $\propto ai=0001$ and the value on bus 170 is $\propto aj=0011$, which means that bit 0 and bit 4 are in error, AND gate 180 in circuit 150 provides a "1" level output signal to the input of OR circuit 184, and AND gate 182 in circuit 154 provides a "1" level output signal to the input of OR circuit 184, so that an invert control signal is generated on line 143 and 147 which causes bits 0 and 4 to be inverted by XOR circuit 130 and 134 and inverted bits to be provided on their output lines 200 and 204. The other circuits 131, 132, 133 and 135 provides the bits 1, 2, 3 and 5 on their output lines 201, 202, 203, 205.

In case of a 1-bit error, none of the AND gates 182 in circuits 150 to 155 provides an output signal at a "1" level.

It could be possible to correct the ECC bits also and provide ECC corrected bits to the processor by adding the logic circuits for generating inverted control signals for correcting the ECC bits.

The description of the present invention has been made using the elements in row a for performing the error detection and correction, however the element in row b could be used as well.

In addition, the code has the capability of detecting error of higher rank, by decoding through table look up circuit 106 that the syndrome S1 is even and that the SaxSb product is different from the values indicated in FIG. 5, namely: $\propto^0$, $\propto^5$, $\propto^7$, $\propto^{10}$, $\propto^{11}$, or $\propto^{14}$, and generating a 4-bit error signal on line 210 which corresponds to an uncorrectable error.

I claim:

1. A method for implementing a triple error detection/double error correction code comprising the steps of:

(a) providing m-data bits and error correction code (ECC) bit with each (ECC) bit being the parity bit of a selected data bit field defined by the binary elements set to a first value (1) in successive rows of a coding matrix comprising m columns and r=2n+1 rows where n is defined as the degree of an irreducible polynomial;

(b) generating a systematic form H1 of a matrix H having m columns and r rows, with a first row R0, comprising m binary elements set to the first value, a first set Ra of rows comprising m n-bit elements $\propto^0$ to $\propto^{[m=1]m-1}$ of a Galois field wherein one element is the identity element of the multiplication $\propto^0$, said elements being generated from an irreducible generator polynomial of degree n, and a second set Rb of rows comprising the same elements as the first set arranged so that the product modulo of the two rows is equal to a constant value such that the systematic form $H1=[T^{(-1)\times H]T-1}xH$ (c) using the systematic form $H1=[T^{(-1)xH-}]T^{-1}XH$ and the m-data bits to generate the error correction bits to be added to the m-data bits;

(d) generating encoded words by concatenating the error correction bits to selected group of m-data bits;

(e) using the systematic form H1 to determine a first error syndrome S1 for each encoded word;

(f) for each encoded word generating a second error syndrome S=TxS1 which is the error syndrome corresponding to the matrix H; and (g) analyzing the first and second error syndromes for determining the number of bits in error and the position of the bits in error if less than three bits are detected in error.

2. The method according to claim 1 in that constant value is the equal to the identity element of the Galois field $\propto^0$.

3. The method according to claim 2, in that the analyzing step further comprises the following steps:

computing the product P=Sa×Sb, where Sa and Sb are subsyndromes of the second syndrome S, corresponding to the first set Ra and the second set Rb of the matrix H, respectively, detecting the parity of the first syndrome S1, generating:

- a three bit error indication signal if syndrome S1 has an odd parity and the product P is different from the identity element of the Galois field ($\propto^0$)
- a single bit error indication signal if syndrome S1 has an odd parity and the product P is equal to the identity element of the Galois field $\propto^0$; and
- a double bit error indication signal if syndrome S1 has an even parity.

4. The method according to claim 3, further comprising the following steps:

building a table comprising the correspondence between the shortest distance between two bits in error, the product P=Sa×Sb and a value E=$(\propto^0+\propto^d)^{-1}$, if a two double bit error is detected at the analyzing step, looking at said table for determining the distance d between two bits in error and the corresponding value E, from the product P computed at the analyzing step, finding the position of one bit in error which corresponds to the column i of the matrix H, in which the element $\propto$ai in the first set Ra of rows is equal to Sa×E, comparing Sa with a first value which is equal to the sum of the elements of the first set Ra of rows in columns i and i+d and with a second value which is equal to the sum of the elements of the first set Ra of rows in columns i and i−d, finding the position of the second bit in error which corresponds to the column i+d if Sa is found equal to the first value or to the column i−d if Sa is found equal to the second value.

5. The method according to claim 3, further comprising the following steps:

building a table comprising the correspondence between the shortest distance between two bits in error, the product P=Sa×Sb and a value E=$(\propto^0+\propto^d)^{-1}$, if a two double bit error is detected at the analyzing step, looking at said table for determining the distance d between two bits in error and the corresponding value E, from the product P computed at the analyzing step, finding the position of one bit in error which corresponds to the column i of the matrix H, in which the element $\propto$bi in the second set Rb of rows is equal to Sb×E, comparing Sb with a first value which is equal to the sum of the elements of the second set Rb of rows in columns i and i+d and with a second value which is equal to the sum of the elements of the second set Rb of rows in columns i and i−d, finding the position of the second bit in error which corresponds to the column i+d if Sb is found equal to the first value or to the column i−d if Sb is found equal to the second value.

6. The method according to claim 3, 4, or 5 further including the step of:

if a single bit error is detected at the analyzing step, finding the position of the bit in error which corresponds to the column i of the matrix H, in which the element $\propto$ai in the first set Ra of rows is equal to Sa.

7. The method according to claim 3, 4, or 5 further including the step of:

if a single bit error is detected at the analyzing step, finding the position of the bit in error which corresponds to the column i of the matrix H, in which the element $\propto$ai in the second set Rb of rows is equal to Sb.

8. The method according to any one of claims 4 or 5 further including the step of inverting the bits found in error for correcting them.

9. An apparatus for implementing a triple error detection/double error correction code comprising: means for providing m-bit words each m-bit word comprising data bits and error correction code (ECC) bits, each (ECC) bit being the parity bit of a selected data bit field defined by binary elements set to a first value (1) in successive rows of a coding matrix comprising m columns and r=2n+1 rows where n is defined as the degree of an irreducible polynomial;

ECC bit generating means 36 for determining the ECC bits to be added to the data bit using a coding matrix HI, such that H1=$T^1$×H, where T is a (r×r) square matrix T, such that T×$T^{-1}$ the identity matrix I and H1 is the systematic form of the matrix H which is a matrix having m columns and r rows, with a first row R0, comprising m binary elements set to said first value (1), a first set Ra of rows comprising m n-bit elements $\propto^0$ to $\propto^{(m-1)}$ of a Galois field wherein one element is the identity element of the multiplication $\propto^0$, said element being generated from an irreducible generator polynomial of degree n, and a second set Rb of rows comprising the same elements as the first set arranged in such a way that in each column the product modulo of the generator polynomial of the element in the first set by the element in the second set is equal to the identity element of the Galois field;

means for providing an encoded word formed from the data bit and the ECC bits;

first error syndrome determining means (44, 52) for using the matrix H1 to determine a first error syndrome S1 from the encoded word;

second error syndrome computing means (56) for computing from said encoded word a second error syndrome S=T×S1 which is the error syndrome corresponding to the matrix H, and analyzing means (54, 60, 68) for analyzing the first and second error syndromes for determining the number of bits in error and the position of the bits in error if less than three bits are determined to be in error.

10. The apparatus according to claim 9, with the analyzing means comprising:

product computing means (60) for computing the product P=Sa×Sb, where Sa and Sb are subsyndromes of the second syndrome S, corresponding to the first set Ra and the second set Rb of the matrix H, respectively, parity detecting means (54) for detecting the parity of the first syndrome S1, error detecting means (68) receiving the product P from the product computing means and the parity from the partity detecting means for generating in response thereto:

- a three bit error detection signal, if syndrome S1 has an odd parity and the product P is different from the identity element of the Galois field ($\propto^0$)
- a single bit error detection signal if syndrome S1 has an odd parity and the product P is equal to the identity element of the Galois field, and
- a double bit error detection signal if syndrome S1 has an even parity.

11. The apparatus according to claim 10, wherein the error deflection means comprises:

table look up means (106) wherein is stored a table comprising the correspondence between the shortest distance d between two bits in error, the product P=Sa×Sb and a value $E=(\alpha^0+\alpha^d)^{-1}$, said means being activated when a double error is detected by the error detection means for determining the distance d between two bits in error and the corresponding value E, corresponding to the product P computed by the product computing means, error position detecting means (112) which are responsive to the distance d and value E computed by the table look up means for generating a signal (∝ai) indicative of the position of one bit in error which corresponds to the column i of the matrix H, in which the element ∝ai in the first set Ra of rows is equal to Sa×E, comparing means (120) for comparing Sa with a first value which is equal to the sum of the elements of the first set Ra of rows in columns i and i+d and with a second value which is equal to the sum of the elements of the first set Ra of rows in columns i and i−d, and generating a signal indicative of the position of the second bit in error which corresponds to the column i+d if Sa is found equal to the first value or to the column i−d if Sa is found equal to the second value.

12. The apparatus according to claim 10 or 11 further comprising means (100, 62, 166) for finding the position of a single bit in error which corresponds to the column i of the matrix H, in which the element ∝ai in the first set Ra of rows is equal to Sa.

13. The apparatus according to any one of claims 10 or 11 further comprising error correction means (80) responsive to the single and double bit error detection signals, to the Sa subsyndrome value, to the signal indicative of the position of the bits in error, for inverting the bits at said positions and providing a corrected word.

* * * * *